United States Patent [19]

Haynes et al.

[11] Patent Number: 4,965,513

[45] Date of Patent: Oct. 23, 1990

[54] MOTOR CURRENT SIGNATURE ANALYSIS METHOD FOR DIAGNOSING MOTOR OPERATED DEVICES

[75] Inventors: Howard D. Haynes, Kingston; David M. Eissenberg, Oak Ridge, both of Tenn.

[73] Assignee: Martin Marietta Energy Systems, Inc., Oak Ridge, Tenn.

[21] Appl. No.: 436,139

[22] Filed: Nov. 14, 1989

Related U.S. Application Data

[63] Continuation of Ser. No. 913,193, Sep. 30, 1986, abandoned.

[51] Int. Cl.$^5$ ............... G01R 23/00; G01R 31/02
[52] U.S. Cl. ................... 324/158 MG; 73/659; 318/490
[58] Field of Search .............. 318/490; 324/158 MG; 364/551; 361/31; 340/648; 73/593, 659, 168, 660

[56] References Cited

U.S. PATENT DOCUMENTS

| | | | |
|---|---|---|---|
| 3,052,117 | 9/1962 | Miller et al. | 324/158 MG |
| 3,292,425 | 12/1966 | Conn | 73/660 |
| 3,793,509 | 2/1974 | Isnard | 324/158 MG |
| 4,123,009 | 10/1978 | Kilpinen | 324/158 MG |
| 4,302,712 | 11/1981 | Pritchard | 318/490 |
| 4,380,172 | 4/1983 | Imam et al. | 73/659 |
| 4,471,308 | 9/1984 | Gable et al. | 324/158 MG |
| 4,527,101 | 7/1985 | Zavis et al. | 318/490 |
| 4,542,649 | 9/1985 | Charbonneau et al. | 73/168 |
| 4,602,343 | 7/1986 | Dougherty | 364/551 |
| 4,744,041 | 5/1988 | Strunk et al. | 318/490 |
| 4,773,263 | 9/1988 | Lesage et al. | 73/659 |

OTHER PUBLICATIONS

Steele et al., "An Electrical Method for Condition Monitoring of Motors" Standard Telecommunication Laboratories Ltd., UK., pp. 231–235.
Hargis et al, "The Detection of Rotor Defects in Induction Motors" Central Electricity Generating Board, UK, pp. 216–220.

*Primary Examiner*—Reinhard J. Eisenzopf
*Assistant Examiner*—W. Burns
*Attorney, Agent, or Firm*—J. M. Spicer; Bruce M. Winchell

[57] ABSTRACT

A motor current noise signature analysis method and apparatus for remotely monitoring the operating characteristics of an electric motor-operated device such as a motor-operated valve. Frequency domain signal analysis techniques are applied to a conditioned motor current signal to distinctly identify various operating parameters of the motor driven device from the motor current signature. The signature may be recorded and compared with subsequent signatures to detect operating abnormalities and degradation of the device. This diagnostic method does not require special equipment to be installed on the motor-operated device, and the current sensing may be performed at remote control locations, e.g., where the motor-operated devices are used in accessible or hostile environments.

4 Claims, 3 Drawing Sheets

MOTOR CURRENT SIGNATURE ANALYSIS METHOD FOR DIAGNOSING MOTOR OPERATED DEVICES

This is a continuation of application Ser. No. 913,193, filed Sept. 30, 1986, now abandoned.

BACKGROUND OF THE INVENTION

This invention, which is a result of a contract with the United States Department of Energy, relates generally to the art of noise signature analysis and, more specifically, to diagnosing electric motor-operated devices based on motor current noise signature analysis.

In the operation of nuclear power plants and chemical process systems, for example, motor-operated valves (MOVs) are used extensively in various control arrangements. To ensure safe and efficient operation and maintain operational readiness in emergency situations, these valves must be maintained so that they perform properly under all anticipated conditions.

The valves are complex mechanical devices which require periodic careful adjustments or repair to maintain operational readiness. Present methods for diagnosing abnormalities specified by the ASME code, for example, have not proved to be adequate in determining time-dependent degradation (aging), incorrect adjustments, and service wear which may cause failures in emergency situations.

Various methods have been applied in the past to motor-operated devices which include different signature analysis methods, such as vibration signature analysis, direct measured mechanical load-time traces and the like. One example of a load-time trace type signature analysis method is disclosed in U.S. Pat. No. 4,542,649, issued September 24, 1985, for "Motor Operated Valve Analysis Testing System," by Arthur G. Charbonneau et al. In this method, which is specific to the testing of certain MOVs, various pieces of hardware are connected to the valve actuator to obtain information on valve performance. This requires access to the valve to perform the testing and limits testing to specific intervals due to the fact that instrumentation must be attached to the valve during testing and then removed. In this method, a displacement measuring device is used to record the axial motion of the valve operator drive worm which in turn drives a worm gear coupled to the valve stem to open or close the valve. Varying stem loads during operation causes limited axial translation of the drive worm which is spring biased. The resultant measurement is a valve stem load-time trace which is calibrated by means of a load cell arrangement which is also connected to the valve stem during initial testing to calibrate movement of the worm drive relative to the imposed stem load.

In the use of vibration signature analysis, special purpose sensors, usually accelerometers, are mounted on the equipment being monitored, which also requires access to the equipment to mount the sensors during testing. The location and orientation of the accelerometers are critical to the characteristics of the signal obtained. A vibration generated in one part of the mechanical device is altered as it is transmitted through the solids (usually metallic) separating the source from the accelerometer. Thus, the interpretation of a vibration signal is complicated by requiring a knowledge of the vibration transmission characteristics of the equipment. In addition, the analysis of the vibration signals taken at different times (in order to detect changes) is dependent on the ability to reproduce the precise location and direction of mounting of the accelerometers. Thus, in most cases, accelerometers and/or their mounting fixtures are permanently installed on the equipment to be monitored.

Since accelerometers sense vibration primarily in one direction, multiple sensors are necessary to detect the vibrations generated in physically isolated parts of some equipment. Thus, in order to sense all significant vibration directions, it is necessary to install multiple sensors. The results obtained must then be combined to develop the diagnostic information.

In addition, accelerometers will sense sources of vibration which are not generated by the drive motor or the device being driven by the motor which is being evaluated. Not only will these vibration sources affect accuracy and precision, they are in general not an influence on the condition of the equipment, and thus represent extraneous and unnecessary information which must be dealt with.

Accelerometers themselves are subject to degradation if exposed to harsh environments, such as in the containment of nuclear power plants. Their accuracy or precision can be influenced by environmental conditions such as temperature, humidity, nuclear radiation, acoustic noise, corrosive substances, electromagnetic interference, and the like. Although in some cases the effects of one or more of these factors can be removed or compensated for, they represent a significant potential source of error, especially in nuclear plant containment environments.

Therefore, it will be obvious from the above discussion that present signature analysis methods are limited and require additional hardware to be attached to the device during testing. These methods are especially limited when used in diagnosing electric motor-operated devices, such as motor-operated valves and the like in hostile environments. The tests are limited to times when the plants in which the devices are used, such as MOVs in nuclear plants, are shut down for routine maintenance. As a result, most of the information provided by testing under these conditions does not address device operational readiness directly, but rather certain abnormalities that could potentially lead to loss of operational readiness.

In order to provide diagnostic information about operational readiness of an electric motor-driven device, especially those types which are unaccessible during normal operation, the magnitudes and types of abnormalities and their rates of change (trends) with time need to be determined. This allows a judgment to be made as to when corrective action should be taken to prevent loss of operational readiness. In order to obtain this type of diagnostic information, signatures need to be obtained continuously or at least during scheduled periods of normal operation of the device for comparison with previous signatures to not only obtain the current status of the magnitude of abnormalities, but also provide trending information.

Thus, it will be seen that there is a need for a signature analysis method for remotely monitoring the operating characteristics of an electric motor-operated device which does not require access to the device or additional hardware to be attached to the device during monitoring.

SUMMARY OF THE INVENTION

In view of the above need, it is an object of this invention to provide a signature analysis method and apparatus for diagnosing operating characteristics of electric motor-operated devices which does not require access to the device or additional hardware to be connected to the device.

Further, it is an object of this invention to provide a signature analysis method as in the above object which is based on sensing the motor current noise which may be detected at any location along the power line leading to the motor of the device.

Other objects and many of the attendant advantages of the present invention will be apparent from the following detailed description taken in conjunction with the drawings.

Briefly, the present invention comprises a signature analysis method and apparatus for diagnosing the operating characteristics of electric motor-driven mechanical devices in which an electrical signal proportional to the measured motor current is analyzed by means of frequency domain signal analysis techniques to provide a motor current noise signature for which various operating characteristics of the device may be observed. It has been found that the motor current noise includes the sum of all of the mechanical load changes which refer back to the electric motor drive. These are separated on a frequency and amplitude basis such that the source of various changes in load may be identified, such as periodic gear mesh loading, friction events at frequencies corresponding to their origin, and other motor load varying characteristics of the device. Thus, motor current noise signatures taken at different periods during the operating life of the device may be compared to determine aging and wear or abnormal operating characteristics without interrupting the normal operation of the device as with prior analysis methods.

DETAILED DESCRIPTION

Figure 1:
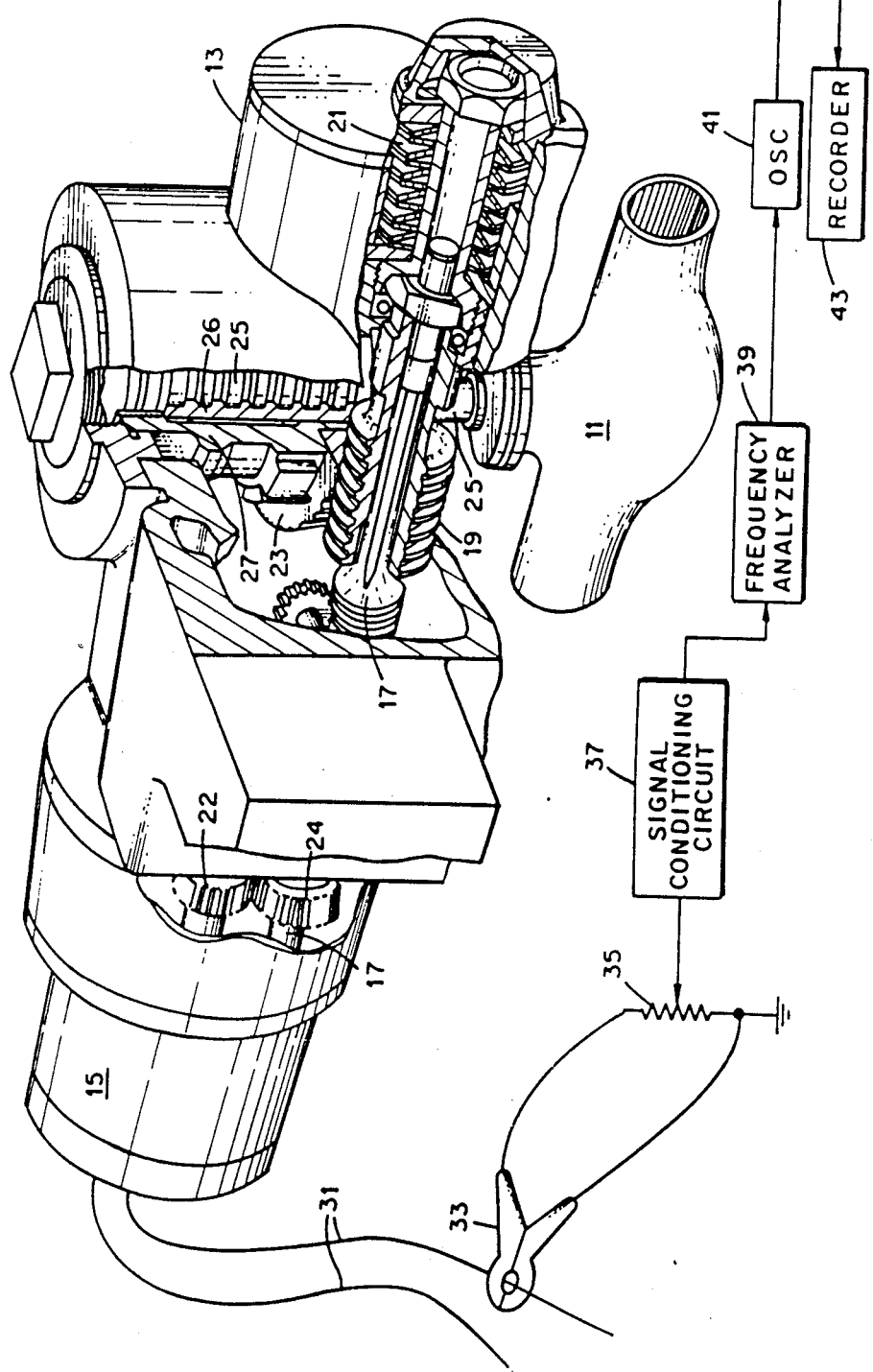
FIG. 1 is a cutaway view of a motor-operated valve together with a schematic representation of instrumentation which may be used to analyze the motor current noise frequency spectrum in accordance with the present invention.

Referring now to FIG. 1, there is illustrated one example of the application of the motor current signature analysis method and apparatus of this invention for diagnosing the operating characteristics of a typical motor-operated valve (MOV) used in various flow arrangements in nuclear power plants. In this arrangement, a valve 11 is connected in a process line and attached to an operator 13. The valve 11 is opened or closed as required for system control by applying power to an electric motor 15 attached to the operator 13 from a control panel, not shown. The motor 15 drives a shaft 17, which in turn drives a worm 19 that is splined to the shaft 17 to allow limited axial displacement of the worm 19 on the shaft 17. Axial displacement of the worm 19 is resisted by means of a cluster of compression springs forming a spring pack 21. The spring pack 21 resists axial motion of the worm 19 in both directions along the shaft and is designed to provide an axial displacement of the worm 19 which is proportional to the torque being transmitted by the worm 19 to a worm gear 23.

The worm 19 drives the worm gear 23 which in turn engages a drive sleeve 27 which rotates a stem nut 26 around the threaded portion of a valve stem 25 of the valve 11, to open or close the valve. Additional controls, not shown, are provided with the operator 13 to detect valve stem 25 opening and closing travel, and to detect worm 19 axial movement, such that they will shut down the motor 15 when the limits associated with either of these controls are exceeded. Specific details of the controls may be had by referring to the above referenced patent or to descriptive materials provided by motor-operator manufacturers, such as Limit Torque Corporation, Lynchburg, Virginia. Under normal operating conditions, power is applied to the motor 15 through two or more power leads 31, depending on the type of motor, to open or close the valve.

In accordance with the motor current noise signature analysis method and apparatus of this invention, the motor current is sensed by means of a conventional clamp-on current transformer 33. Such devices are simply clamped about a single lead 31 to the motor 15 without requiring removal of insulation or breaking the wire. Installation direction or location does not affect either precision or accuracy. The motor current noise signal may be read with equal accuracy and precision by sensing the motor current anywhere along the wire 31 running from the motor back to the switch which directs the current from a common main to the wires carrying it to the motor. A preferred location is at the motor control center since that is located in a mild environment outside of containment in a nuclear power plant, for example. There is no issue regarding reproducibility of the noise signal content of the current signal taken at different times or locations along the motor lead 31.

The current transformer secondary (output), which is a variable current signal proportional to the time-varying current flowing in the lead 31, is connected across a load resistor 35 to generate a varying voltage across the resistor which is proportional to the motor current. The resistor 35 may be in the form of a potentiometer, as shown, with one end grounded. The variable contact of the potentiometer is connected to the input of a signal conditioning circuit 37. The potentiometer is adjusted to provide a selected proportional relationship between the motor current and the corresponding AC voltage signal applied to the signal conditioning circuit 37. The circuit 37 includes a demodulator, in this case an RMS-to-DC converter, a device which produces a voltage proportional to the root-mean square (RMS) value (over a preset time interval), of the motor current signal. The demodulated signal is fed through a low pass filter having an upper frequency cutoff below 60 Hz to remove spectra associated with the 60 Hz line frequency and its harmonics.

The conditioned voltage signal is then analyzed using conventional frequency domain signal analysis techniques to provide the motor current noise signature. By applying the conditioned DC voltage signal to the input of a conventional frequency analyzer 39 adjusted to scan various frequency ranges between 0 and about 60 Hz, a detailed analysis of the frequency content of the voltage signal is obtained which represents the motor current noise frequency content. The frequency analyzer may take various forms, such as the Model 3582A supplied by Hewlett Packard.

The noise frequency spectra may be displayed on an oscilloscope 41 and/or recorded on a recording device 43, such as an X-Y plotter to obtain the frequency spectrum plots as shown in FIGS. 2-6. By analyzing the motor current noise frequency content for an opening or closing cycle of the valve operator 13 in the range below 60Hz, one may observe the signal content at those frequencies where periodic contributions to motor load are sensed. These frequencies have been observed to be at the various known mechanical gear meshings and shaft rotational frequencies of the motor operated valve system where oscillations in motor load occur.

In addition to the fundamental frequency content, harmonic and sideband components are also observed. Those are indicators of a variety of mechanical modulations associated with time-dependent degradation including gear tooth wear, shaft eccentricity, and bearing noise which may change as the MOV suffers aging and wear due to operation and/or maintenance actions.

Motor current noise includes the sum of all of the mechanical load changes which refer back to the electric motor drive. The relative magnitude of the electric noise signal generated by a particular mechanical noise source will depend on its absolute magnitude and on its mechanical linkage to the motor which remains a fixed relationship for a given device. The motor itself acts as a transducer changing the mechanical load variations into electrical noise.

Figure 2:
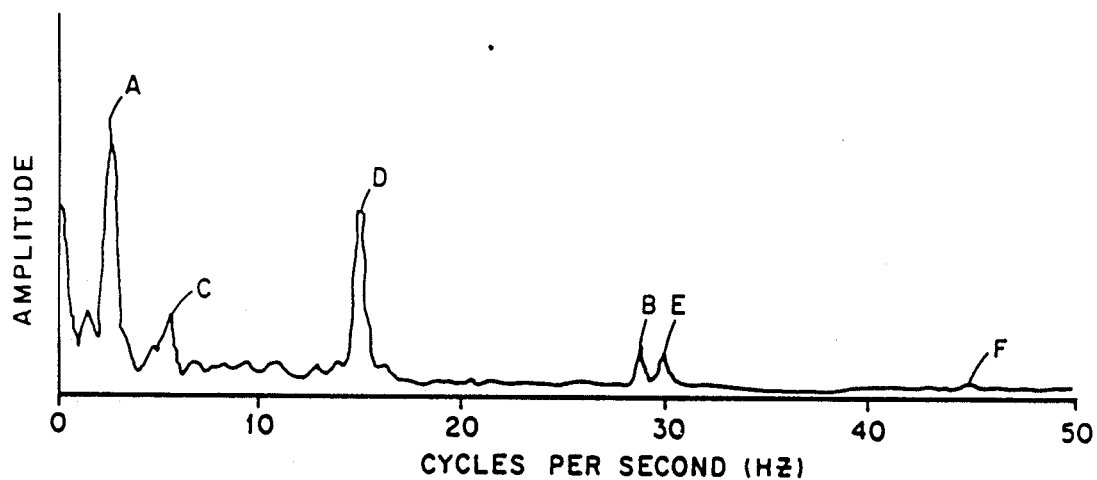
FIG. 2 is a plot of frequency (0–50 Hz) versus amplitude, in arbitrary units, of the motor current noise spectrum for a motor-operated valve as shown in FIG. 1 during a closed-to-open cycle of the valve operation.
Figure 3:
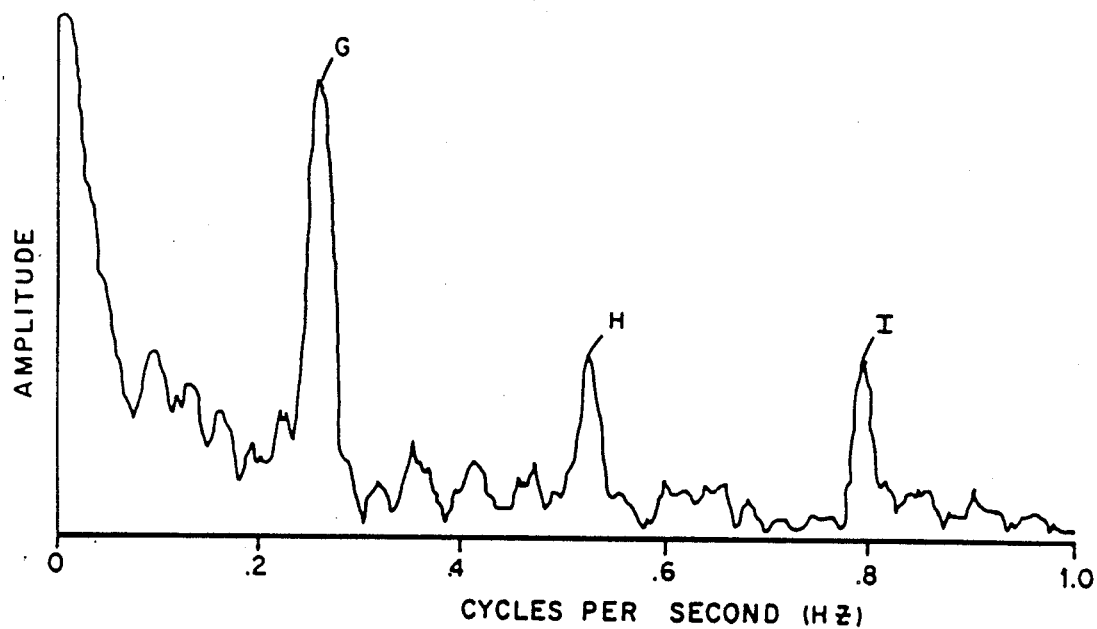
FIG. 3 is a plot as in FIG. 2 of a selected frequency band (0–1Hz) with an expanded scale of frequency in Hertz and amplitude in arbitrary units.
Figure 4:
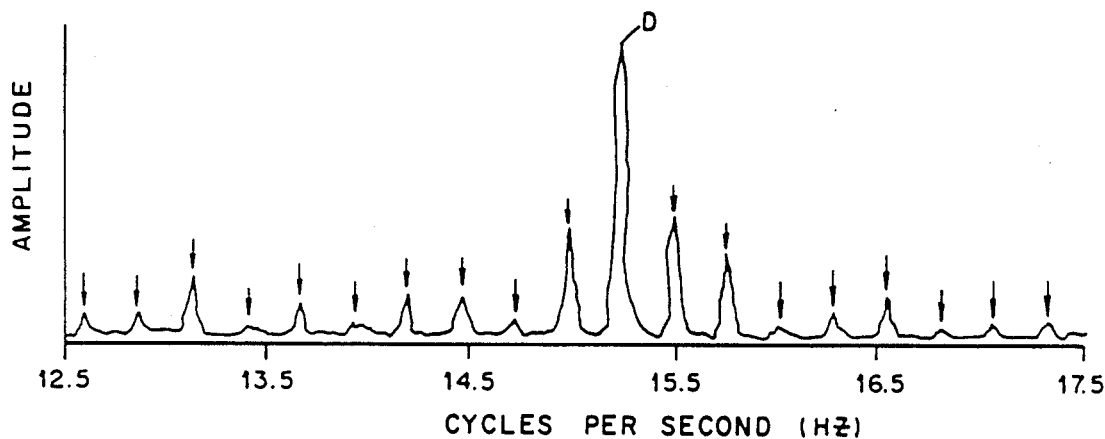
FIG. 4 is an expanded scale plot of the information in FIG. 2 over the frequency range of from 12.5 to 17.5 Hz.
Figure 5:
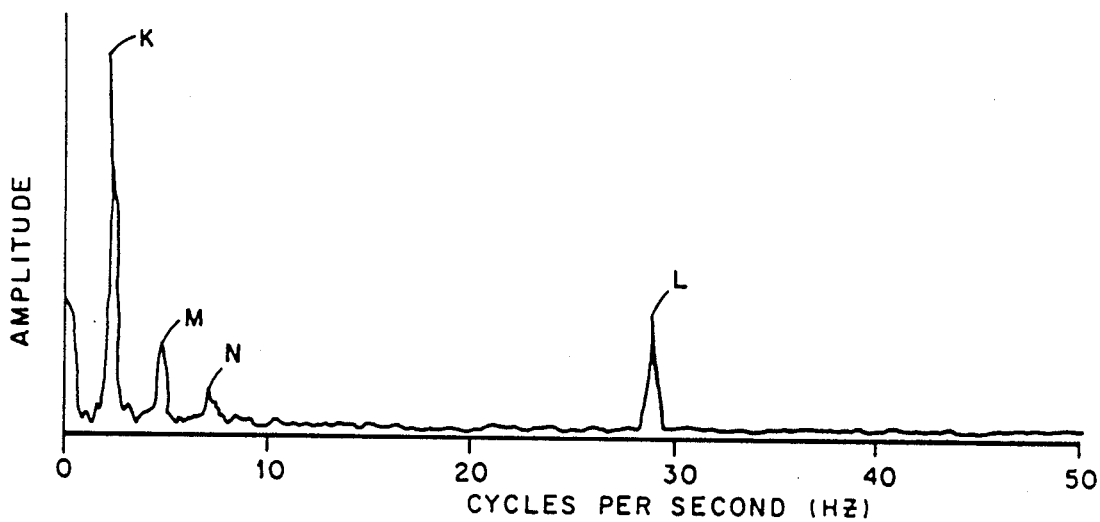
FIG. 5 is a plot of frequency versus amplitude, in arbitrary units, of the motor current noise spectrum of an operating electric fan over the range of from 0 to 50 Hz.

Referring now to FIGS. 2, 3, and 4, the motor current noise analysis method of this invention will be illustrated as applied to the analysis of a motor-operated valve as shown in FIG. 1. The current to the motor 15 is sensed and the motor current noise frequency signatures of FIGS. 2, 3, and 4 are obtained during valve operation in a closed-to-open direction, where for each figure, the range of frequencies to be plotted are adjusted by changing the settings of the frequency analyzer prior to operating the valve for that stroke. Similar analysis may be made during open-to-closed cycles of valve operation. The particular frequency range selected for the signatures will depend on the various elements of the valve to be analyzed. As shown in FIG. 2, a frequency plot over the range of from 0 to 50 Hz may be used to analyze relatively high amplitude frequency components of the motor current noise. This plot was obtained during a closed-to-open cycle of operation of the valve of FIG. 1 which takes approximately 55 seconds. The analyzer 39 acquires and stores the amplitudes over the sampled frequency range of the noise signal which are then displayed on the scope and/or recorded by the recording device 43. Since the motor 5 is a 3-phase, 4 pole induction motor having a synchronous speed of 1,800 r.p.m. (30 Hz), the frequency component at point A is a i measure of the motor slip frequency (2.8 Hz) which may be verified by calculation as follows:

$$\text{Motor Slip Freq.} = \left[ \begin{array}{c} \text{Synchronous} \\ \text{Motor Shaft} \\ \text{Speed} \end{array} - \begin{array}{c} \text{Actual} \\ \text{Motor Shaft} \\ \text{Speed} \end{array} \right] \cdot K$$

$$= (30 \text{ Hz} - 29.3 \text{ Hz})(4) = 2.8 \text{ Hz};$$

where K is the number of poles in the motor. The actual motor speed is represented by the peak B at 29.3 Hz. Thus, from an analysis of this noise frequency spectrum one can accurately determine the average slip frequency and thus the magnitude of the load being driven by the motor. These values may be compared with subsequent signatures to detect changes which may be caused by abnormal loads or valve and/or valve operator degradation, for example. Therefore, the motor current noise spectral analysis provides a quantity which is not obtainable from other analysis methods, such as vibration spectral analysis, and is an important tool in diagnosing the condition of the equipment of interest. The peak at C (5.6 Hz) is the first harmonic of the motor slip frequency which is at a frequency twice that of the slip frequency (2.8 Hz).

The peak at D (15.3 Hz) is the worm 19 to worm gear 23 toothmeshing frequency, which is also the worm 19 rotation speed, which may be verified as follows:

$$\text{Worm Rotation Speed} = \left[ \begin{array}{c} \text{Motor Shaft} \\ \text{Speed} \end{array} \right] \cdot$$

$$\left[ \frac{\text{Motor Pinion Gear Teeth}}{\text{Worm Shaft Gear Teeth}} \right]$$

$$= [29.3 \text{ Hz}] \cdot \left[ \frac{24}{46} \right] = 15.3 \text{ Hz};$$

where the motor pinion gear is the gear 22 (FIG. 1) located on the motor 15 shaft and the worm shaft gear is the gear 24 mounted on the splined worm shaft 17 which meshes with the pinion gear 22 to drive the worm shaft 17. The peaks at E (30.6 Hz) and F (45.9 Hz) are the first and second harmonic frequencies of the worm rotation speed, respectively. The changes in the amplitudes of these characteristic frequencies may be monitored in subsequent noise signatures to determine wear of the gear teeth as the valve ages.

Portions of the frequency spectrum of FIG. 2 were obtained separately during other cycles of the valve as shown in FIGS. 3 and 4 by operating the valve with the frequency analyzer set for a narrower range of frequencies. As illustrated in FIG. 3, the frequency range between 0 and 1 Hz better reveals the worm gear 23 and valve stem drive nut 26 rotation. As shown in FIG. 1, the drive nut 26 which is driven by gear 23 threadably engages the valve stem 25 to raise or lower the valve 11 obturator (not shown). The peak at G (0.268 Hz) is the stem nut 26 rotation frequency, which is equal to the worm gear rotation frequency and may be verified as follows:

$$\text{Stem Nut Rotation Freq.} = \frac{\text{Worm Rotation Speed}}{\text{Number of Teeth on Worm Gear}}$$

$$= \frac{15.3 \text{ Hz}}{57} = .268 \text{ Hz (16.08 RPM)}.$$

The worm rotation speed is determined from the peak D in FIG. 2. The relative amplitude of the noise frequency component G and its harmonics H, I are indicative of the various loads associated with the valve stem which may change due to changes in friction levels brought about by aging-wear or loss of lubricant, valve stem shaft mis-alignment due to wear or bending from over torquing during obturator seating, etc. Thus, this component of the noise signature and its harmonics at peaks H (0.536 Hz) and I (0.804 Hz) may be analyzed by comparing signatures as the valve ages to determine abnormal valve stem friction loads, valve stem warpage or mis-alignment, etc. Thus, techniques may be used to determine valve degeneration or isolate abnormalities which may be used to evaluate operational readiness of the valve and valve operator under operating conditions by periodically analyzing the device in accordance with the above method.

FIG. 4 shows an expanded plot in a frequency range about the worm rotation frequency (D) 15.3 Hz, which shows the various side band frequencies ±n (Worm Gear Rotation Frequency). This noise signature may be used to provide additional detailed information about the low frequency spectra that was obtained from FIG. 2 and FIG. 3.

This results from the fact that the spectrum analyzer can acquire data at higher frequencies more effectively than at lower frequencies. The spectra shown in FIG. 4 is thus seen to contain the same spectra as contained in FIGS. 2 and 3 but also many sidebands that were lost in the background noise of FIGS. 2 and 3. The presence of sidebands indicates some problem with the worm gear or stem nut, and increases in the number of harmonics and/or their magnitude indicates an increase in degradation of the worm gear or stem nut.

To further illustrate the use of this method for diagnosing the operating characteristics of an electric motor-operated device, the analyzing circuit shown in FIG. 1 was used to obtain a motor current noise signature of an air circulation fan driven by a ⅓ horsepower induction motor. The leads to the motor were separated and the current transformer 33 was clamped about one lead between a switch and the motor. The motor current noise frequency spectrum plot shown in FIG. 5 was obtained. The peak K shows the motor slip frequency at 2.44 Hz, which was verified, as shown in the above example, from the actual motor shaft speed (29.39 Hz) taken from the plot at peak L. The peaks at M and N are the first and second harmonics, 4.88 Hz and 7.32 Hz, respectively, of the motor slip frequency.

Figure 6:
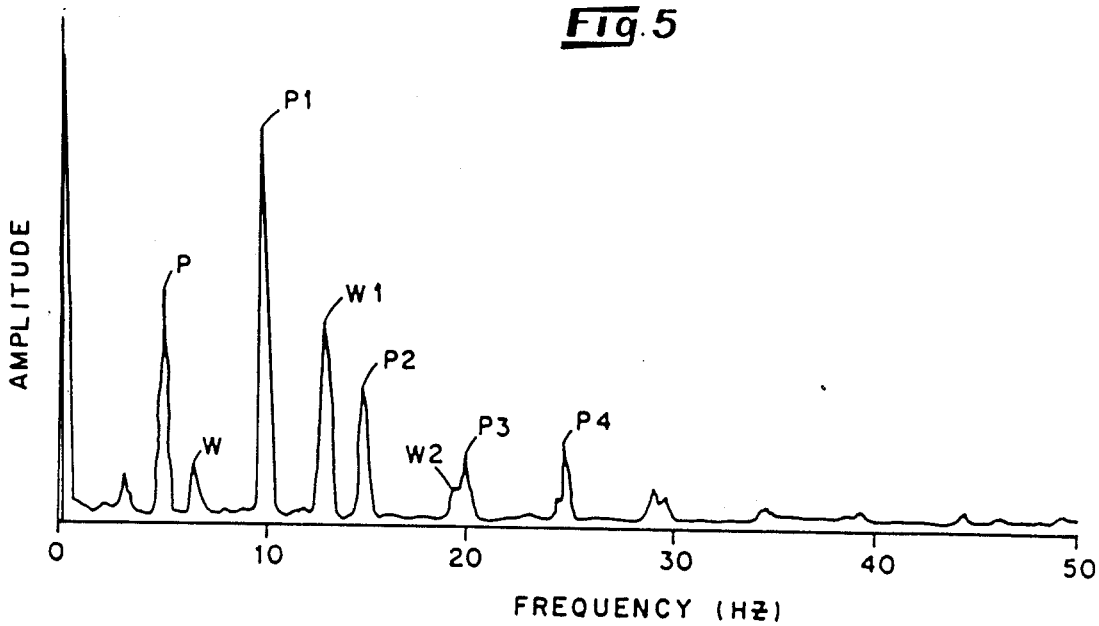
FIG. 6 in a plot of frequency versus amplitude, in arbitrary units, of the motor current noise spectrum of an induction motor-driven vacuum pump over the range of from 0 to 50 Hz. The vacuum pump is driven by means of a belt attached between the motor and the pump.

The method is further illustrated in FIG. 6, which is a motor current noise frequency spectrum for a vacuum pump driven by an induction motor through a belt drive arrangement. From this motor current noise spectrum, between 0 and 50 Hz, one is able to resolve the drive belt revolution frequency, the peak P at 5 Hz, and the pump wheel or pulley frequency, the peak W at 6.5 Hz. The pulley revolution frequency was verified by utilizing a conventional calibrated stroboscope. Then by knowing the belt length, 48.5 inches, and the circumference of the pump wheel, 37.3 inches, the pulley frequency may be verified as follows:

$$\text{Belt Frequency} = \left[ \frac{\text{Pump Wheel Circumference}}{\text{Belt Length}} \right] \cdot \left[ \begin{array}{c} \text{Pump Wheel} \\ \text{Frequency} \end{array} \right]$$

$$= \left[ \frac{37.3 \text{ in.}}{8.5 \text{ in.}} \right] \cdot [6.5 \text{ Hz}]$$

$$= 5.0 \text{ Hz}.$$

The peaks at P1 (10 Hz), P2 (15 Hz), P3 (20 Hz) and P4 (25 Hz) correspond to the first through the fourth harmonics, respectively, of the belt revolution frequency. The peaks at WI (13 Hz) and W2 (19.5 Hz) correspond to the first and second harmonics, respectively, of the pump wheel frequency.

Thus, it will be seen that a sensitive motor current noise analysis method and apparatus have been provided which may be used to diagnose various operating characteristics of an electric motor-driven device. The method does not require access to the device since no instrumentation or sensors have to be placed on the device in the working environment where it could be damaged or would require maintenance. The method only requires sensing the current to the motor which may be obtained at any point between the motor and the switch without disconnecting leads to the motor, allowing analysis of the device to be made from a control room or remote control panel.

This method may be combined with other features of motor current analysis, such as the analysis of the motor current signature in the time domain when opening or closing a motor-operated valve to detect peak motor current at start up and motor current demand throughout the entire valve stroke, for example, to provide a comprehensive evaluation of a motor operated device. It will be apparent to those skilled in the art that various modifications and applications of the method and apparatus to various electric motor-operated devices may be made without departing from the spirit and scope of the invention as set forth in the following claims which are attached hereto and form a part of this application.

We claim:

1. A method for diagnosing operating characteristics of a device driven by an operating electric motor wherein said device produces noise in a current drawn by said motor, comprising the steps of:
   sensing said current drawn by said motor;
   determining a frequency range based on a specific operating element whose operating characteristics are to be analyzed;
   measuring jamplitudes of various frequencies of said current within said frequency range;
   storing said ;measured frequency amplitudes as a frequency spectrum in a recording device in the form of a frequency domain recording to form a a recording of a frequency spectrum;
   comparing said stored frequency domain recording with other frequency domain recordings to detect changes in the operating characteristics of said device; and comparing said stored frequency domain recording with time domain recordings to determine additional operating characteristics of said device.

2. A method for diagnosing operating characteristics of a device driven by an operating motor that draws an electric current, comprising the steps of:
   operating the motor to drive the device;
   sensing an electric current drawn by the motor during an operation of the device, to produce a detect signal;
   determining a frequency range based on a specific operating element whose operating characteristics are to be analyzed;
   generating, at a first time, a first frequency signature, within the frequency range, from the detect signal in the form of a plurality of amplitude values at a plurality of frequency values, the frequency values and associated amplitude values of the first frequency signature corresponding to the frequencies and the associated amplitudes in the detect signal;
   generating, at a second time, a second frequency signature from the detect signal, said second frequency signature having a same form as the form of the first frequency signature;
   comparing the first and second frequency signatures to determine information as to the operating characteristics of the device;
   identifying specific side band frequencies that are indicative of a degradation of an operating characteristic of the device;
   comparing the first and second frequency signatures to determine a presence of the specified side band frequencies in the second frequency signature as compared to the first frequency signature; and
   determining a degradation condition in an operating characteristic of the device when said presence is detected.

3. A method for diagnosing operating characteristics of a device driven by an operating motor that draws an electric current, comprising the steps of:
   operating the motor to drive the device;
   sensing an electric current drawn by the motor during an operation of the device, to produce a detect signal;
   determining a frequency range based on a specific operating element whose operating characteristics are to be analyzed;
   generating, at a first time, a first frequency signature, within the frequency range, from the detect signal in the form of a plurality of amplitude values at a plurality of frequency values, the frequency values and associated amplitude values of the first frequency signature corresponding to the frequencies and the associated amplitudes in the detect signal;
   generating, at a second time, a second frequency signature from the detect signal, said second frequency signature having a same form as the form of the first frequency signature;
   comparing the first and second frequency signatures to determine information as to the operating characteristics of the device;
   identifying at least one side band frequency that is an indication of an operating characteristic of the device; and
   analyzing the side band frequency in the first and second frequency signatures to determine information as to the operating characteristic.

4. An apparatus for diagnosing operating characteristics of a device driven by an operating electric motor wherein said device produces noise in a current drawn by said motor, comprising:
   means for sensing said current drawn by said motor;
   means for specifying a frequency range based on a specific operating element whose operating characteristics are to be analyzed;
   spectrum analyzer means for measuring amplitudes of a frequency spectrum of said current;
   means for storing said measured frequency spectrum amplitudes in a recording device in the form of a frequency domain recording, to form a recording of a frequency spectrum;
   means for comparing said stored frequency domain recording with other frequency domain recordings to detect changes in the operating characteristics of said device,
   wherein said comparing means also includes means for comparing said stored frequency domain recordings with time domain recordings to determine additional operating characteristics of said device.

* * * * *